United States Patent [19]
Joosse

[11] Patent Number: 4,994,774
[45] Date of Patent: Feb. 19, 1991

[54] INTEGRATED LOW-PASS FILTER ARRANGEMENT

[75] Inventor: Cornelis Joosse, Eindhoven, Netherlands

[73] Assignee: U.S. Philips Corporation, New York, N.Y.

[21] Appl. No.: 306,008

[22] Filed: Feb. 2, 1989

[30] Foreign Application Priority Data

Feb. 19, 1988 [NL] Netherlands ............... 8800421

[51] Int. Cl.⁵ ............................................. H03H 7/00
[52] U.S. Cl. ................................... 333/172; 333/167; 307/520
[58] Field of Search ............... 333/172, 182, 213, 214, 333/165–167; 330/303, 306; 307/520, 521, 543, 556

[56] References Cited

U.S. PATENT DOCUMENTS

| | | | |
|---|---|---|---|
| 3,305,801 | 2/1967 | Hartenstein | 333/172 X |
| 3,524,081 | 8/1970 | Campanella | 307/543 |
| 3,529,266 | 9/1970 | King | 333/81 |
| 3,588,533 | 6/1971 | Rhoton | 307/520 |
| 4,114,117 | 9/1978 | Ford | 333/172 X |
| 4,219,745 | 8/1980 | Hersman | 307/543 X |
| 4,539,617 | 9/1985 | Delaney et al. | 333/181 X |
| 4,601,061 | 7/1986 | Carney et al. | 333/172 X |

OTHER PUBLICATIONS

Voorman et al., "Bipolar Integration of Analog and Laguerre Type Filter", ECCTD, pp. 108–110, Sept. 6–8, 1983.

Primary Examiner—Eugene R. LaRoche
Assistant Examiner—Seung Ham
Attorney, Agent, or Firm—Bernard Franzblau

[57] ABSTRACT

An integrated low-pass filter arrangement comprising one or more resistor sections coupled between the input terminals and the output terminals and a capacitor section coupled between the output terminals. Each resistor section comprises two diodes arranged in anti-parallel. The impedance connected to the output and the amplitude of the input alternating voltage are selected in such a way that the threshold voltage of the anti-parallel diodes is not exceeded. If the direction and magnitude of the leakage currents through the diodes are known the instantaneously non-conducting diode of the anti-parallel diode array may be omitted.

13 Claims, 17 Drawing Sheets

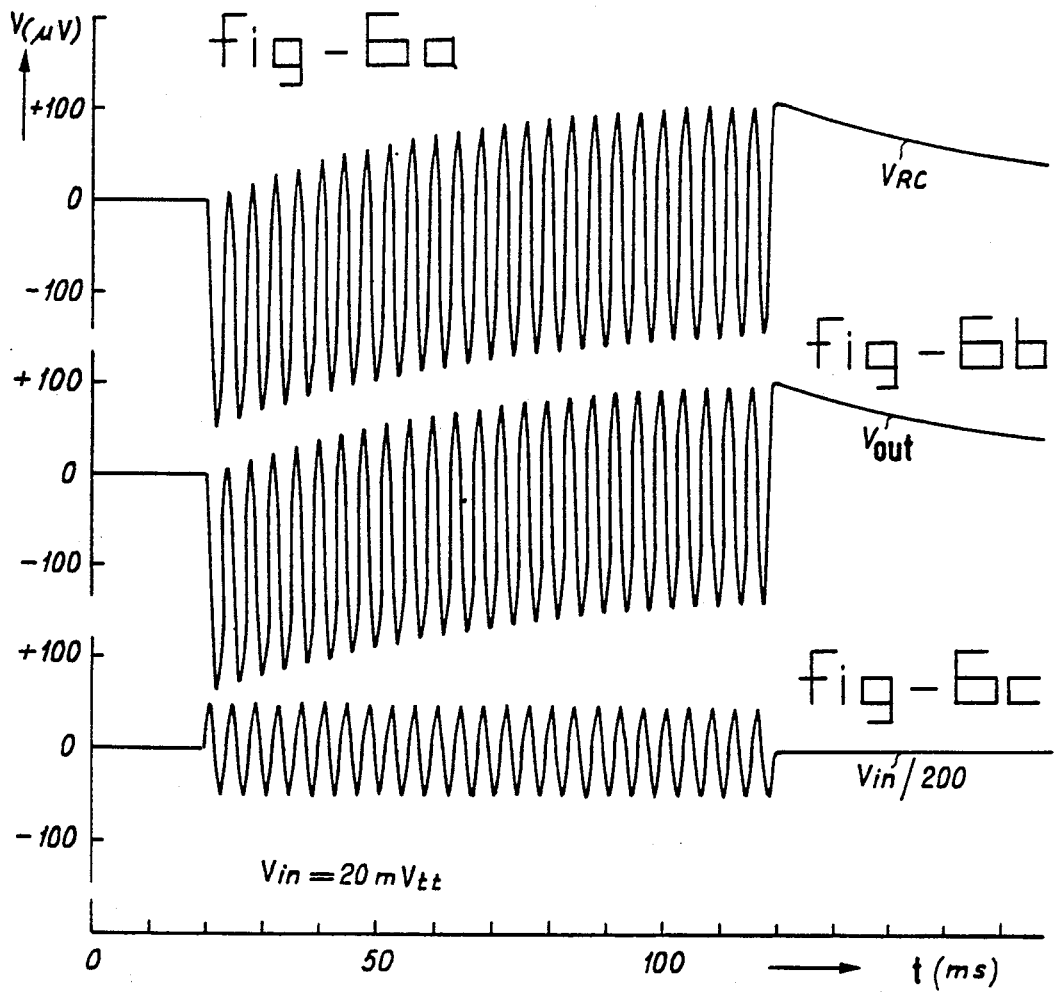
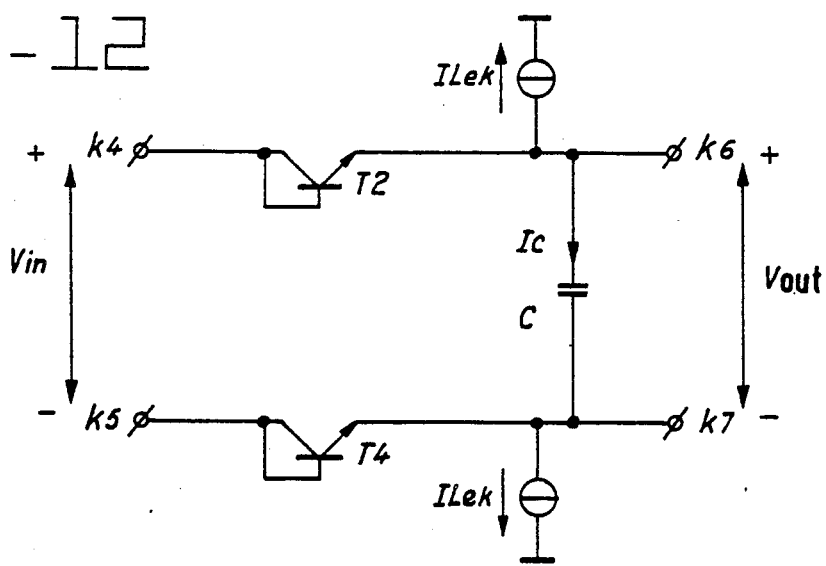

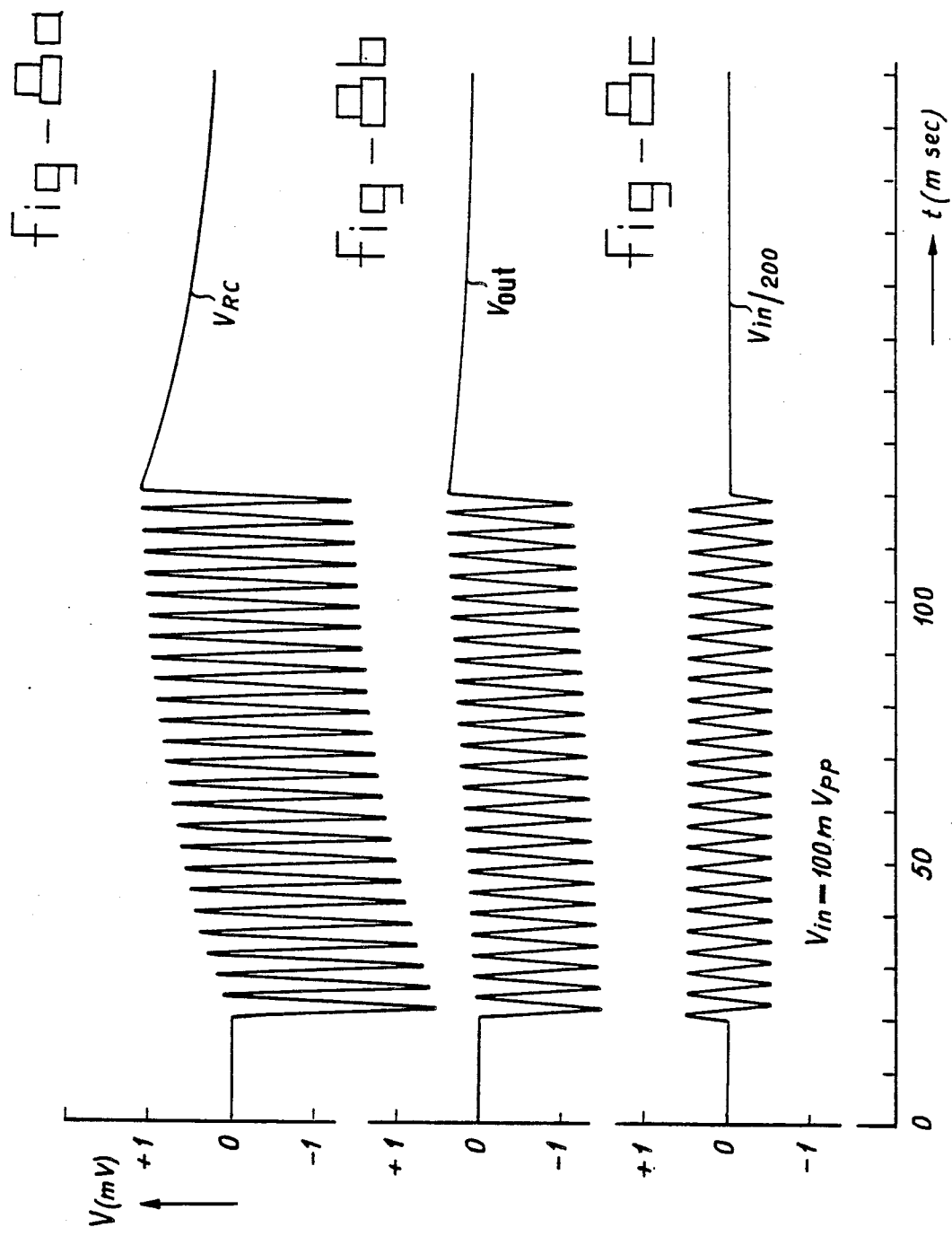

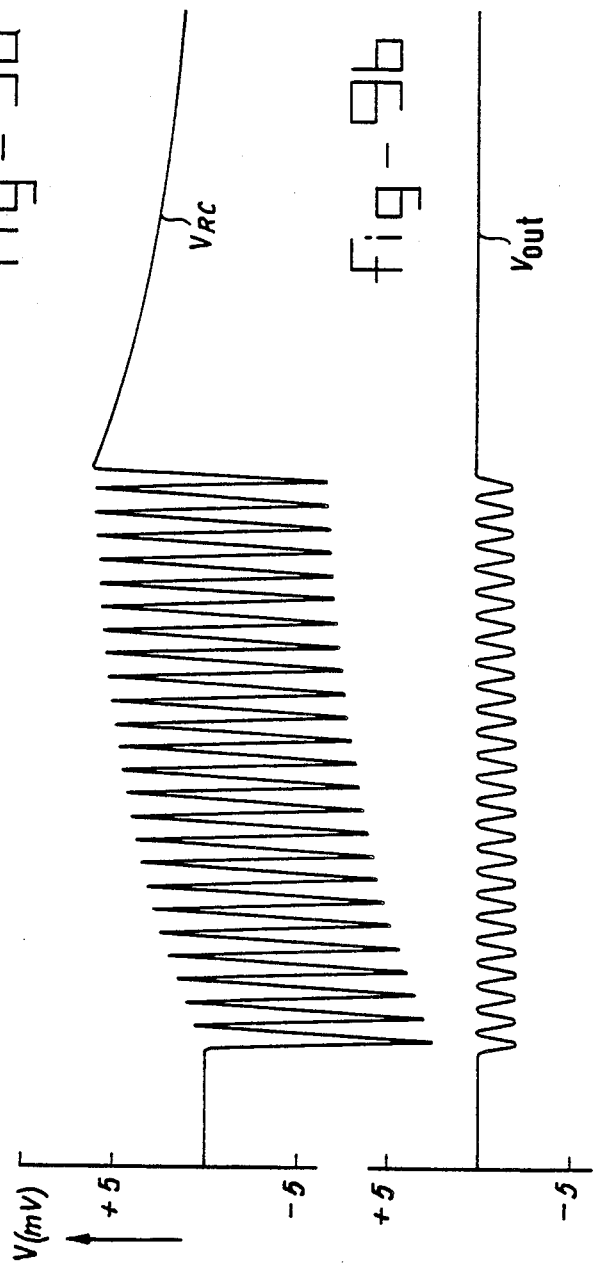

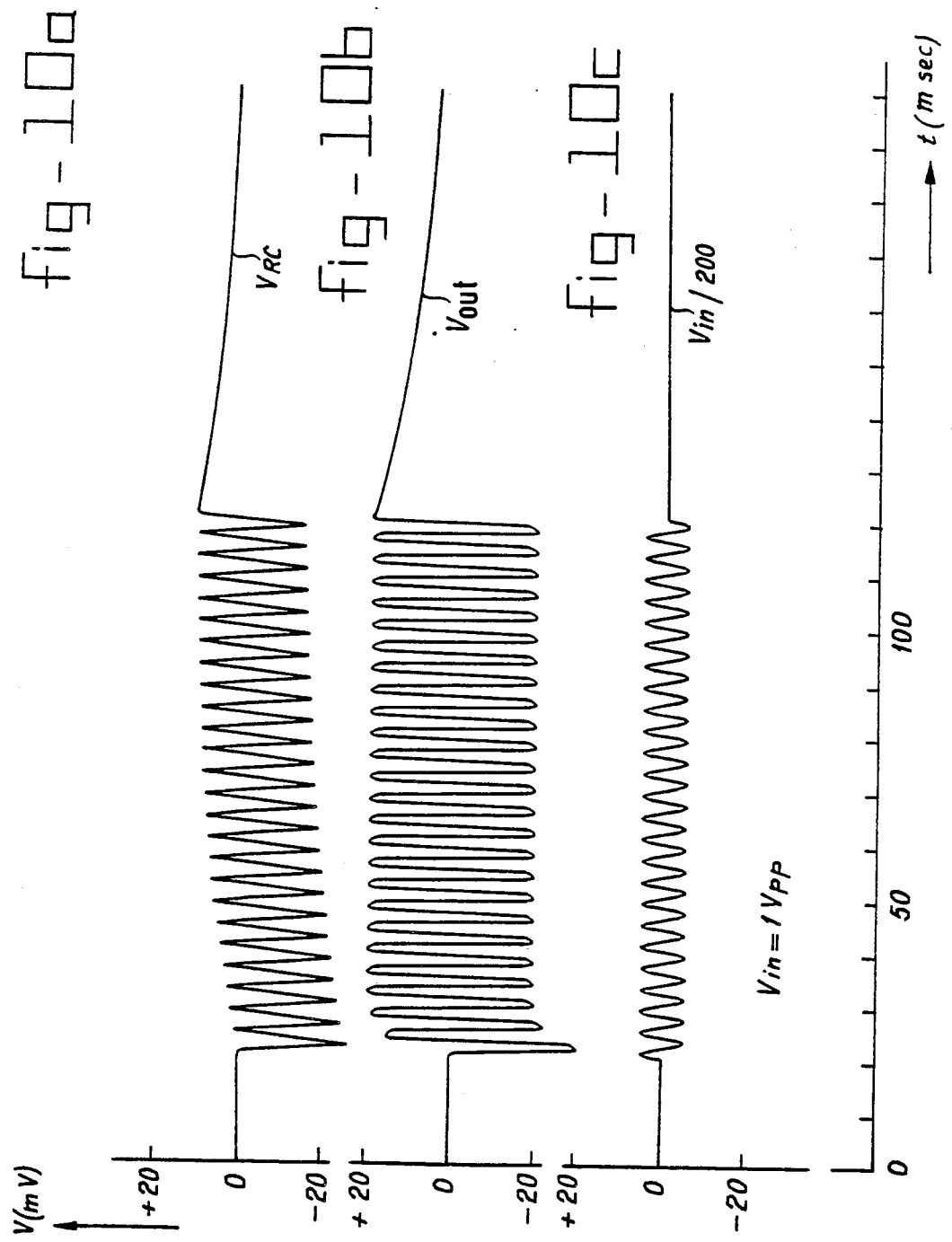

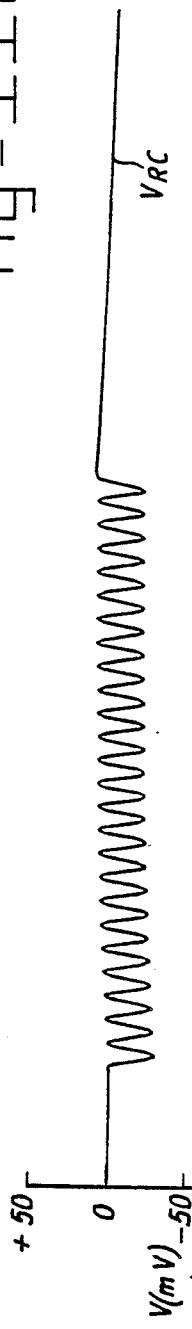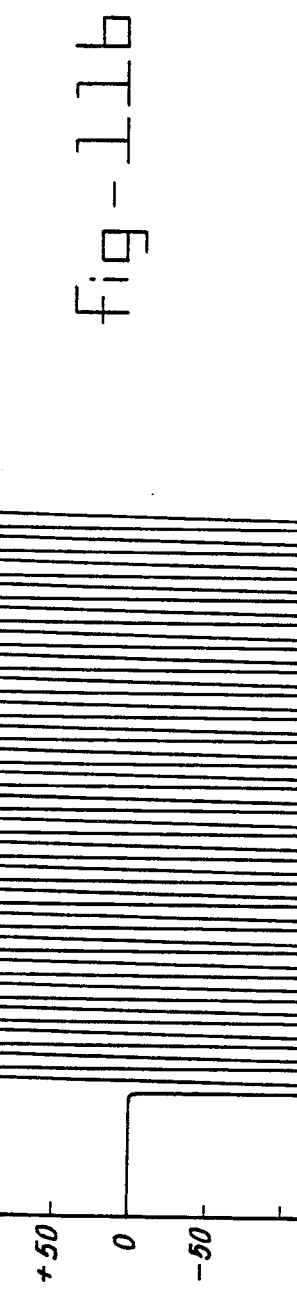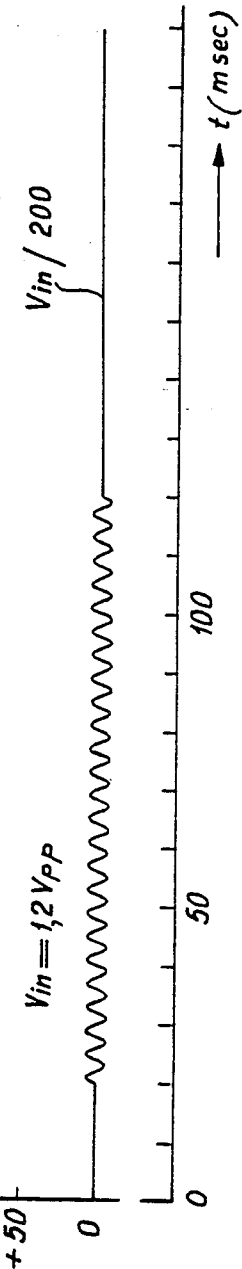

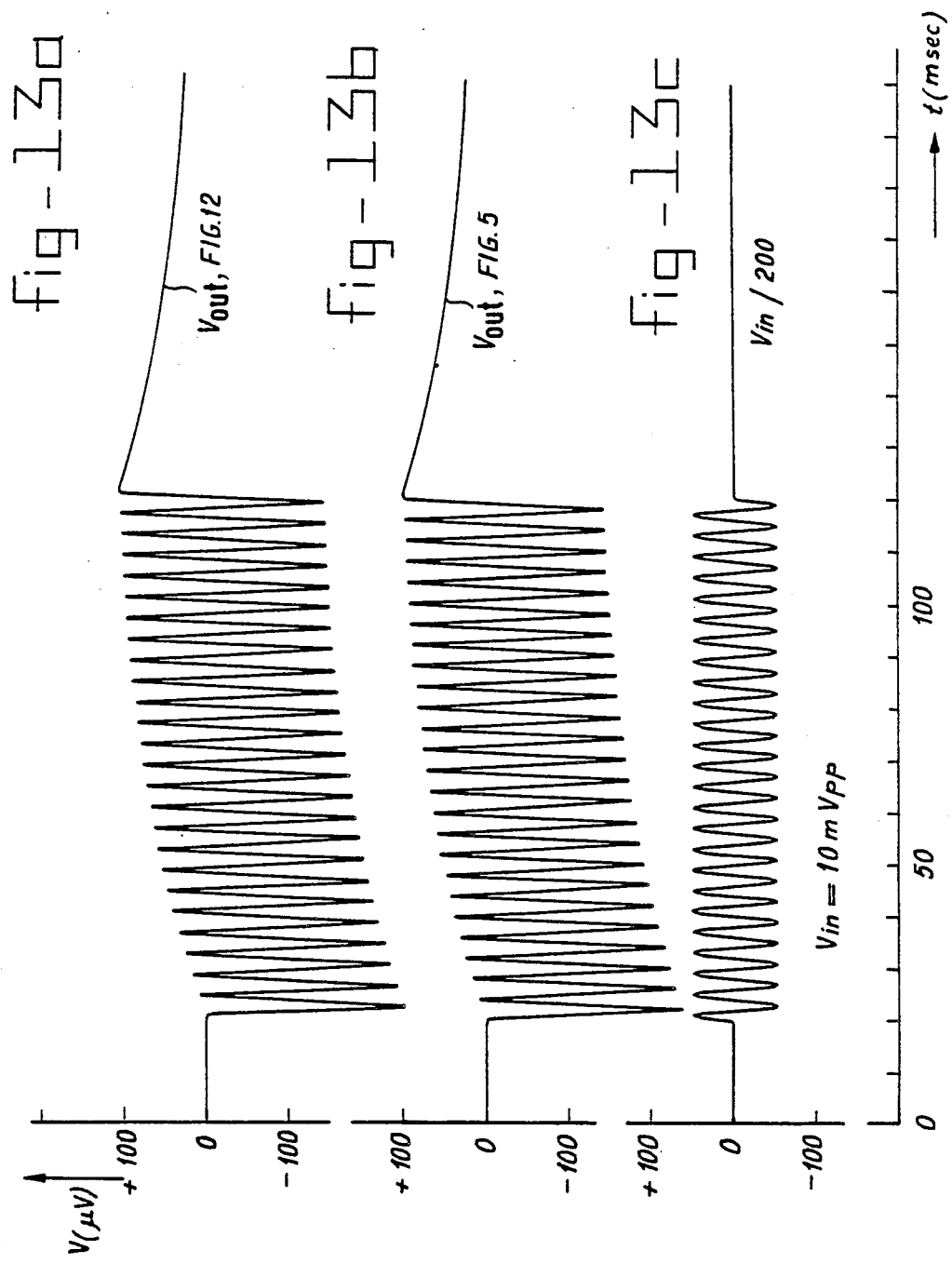

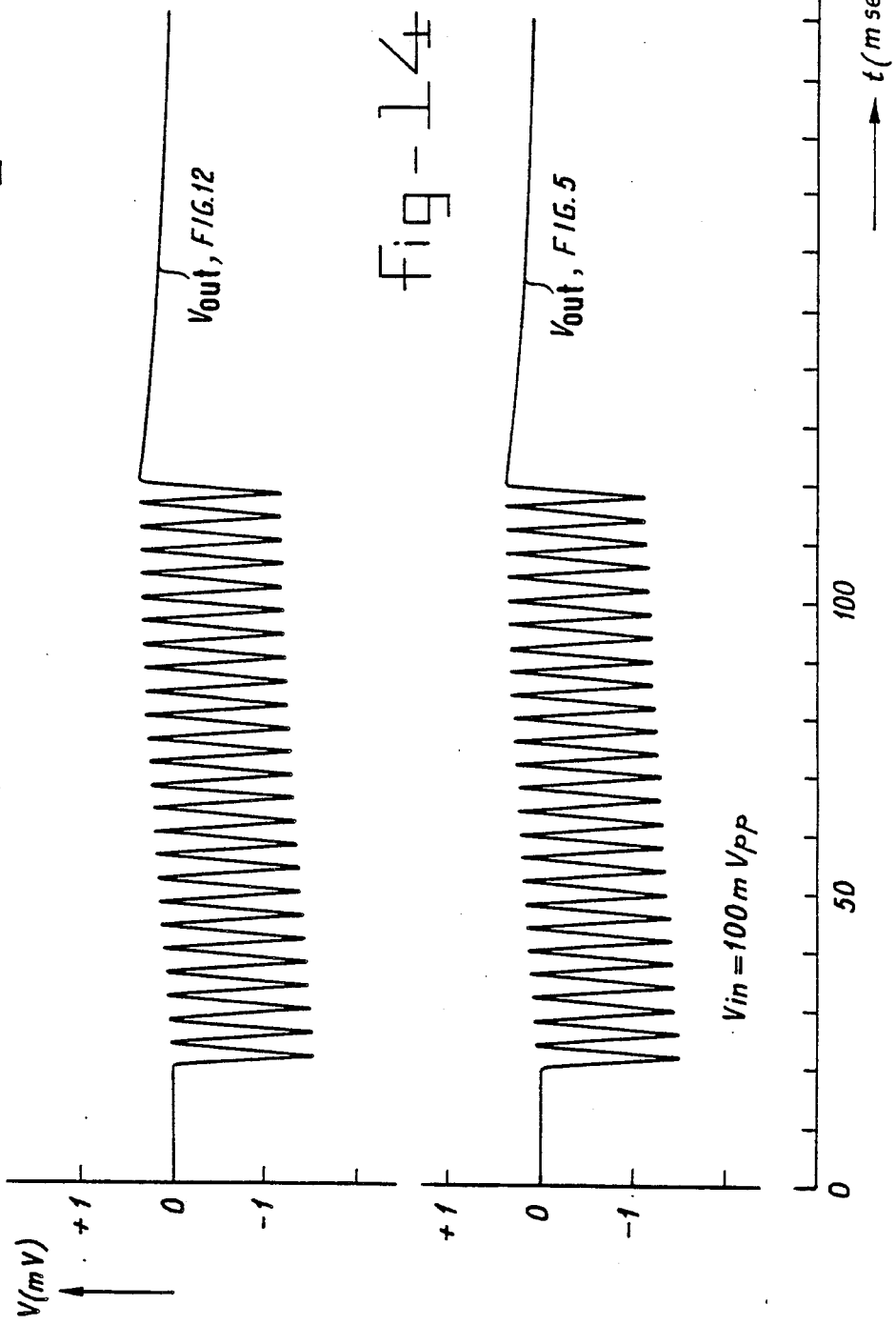

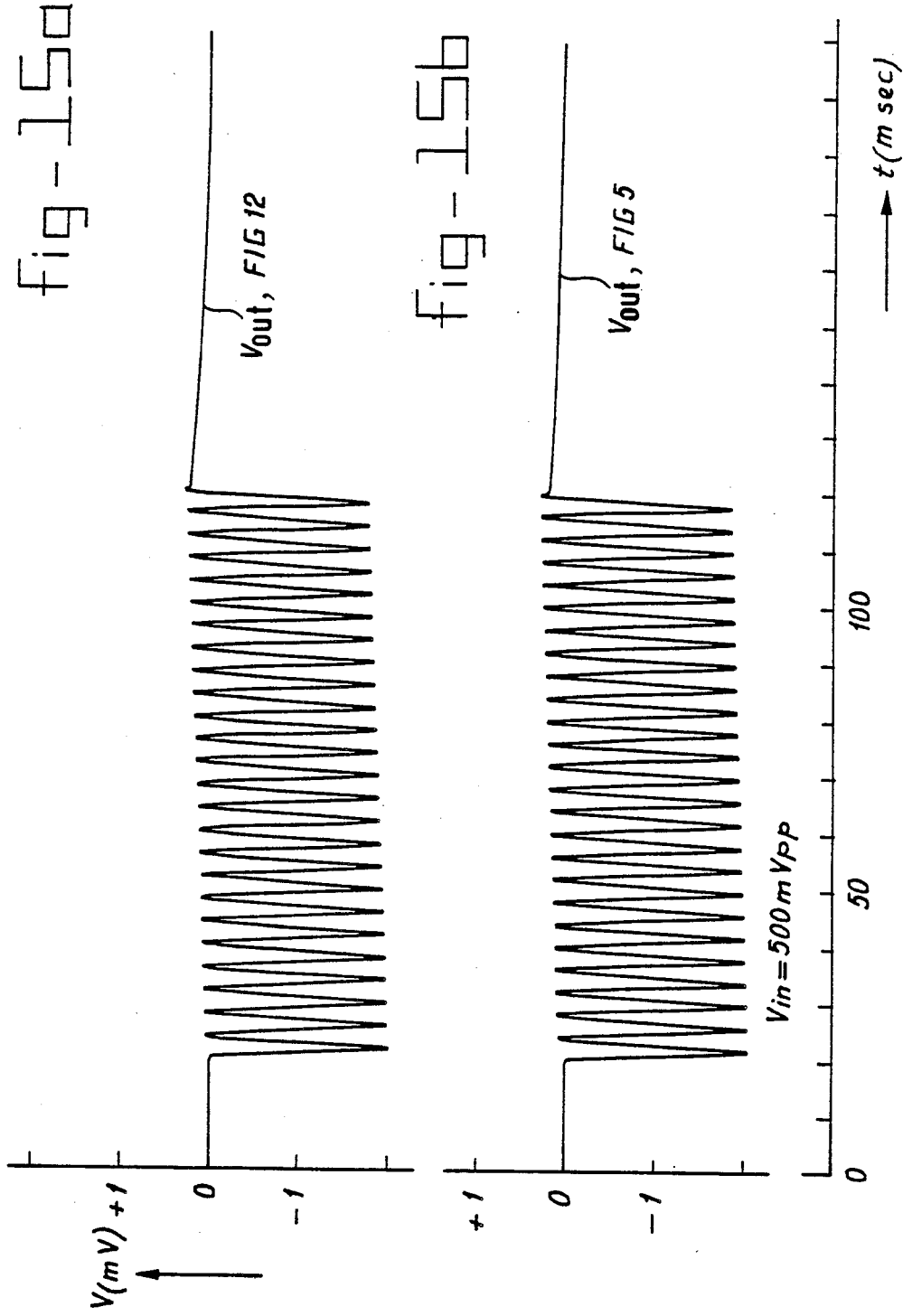

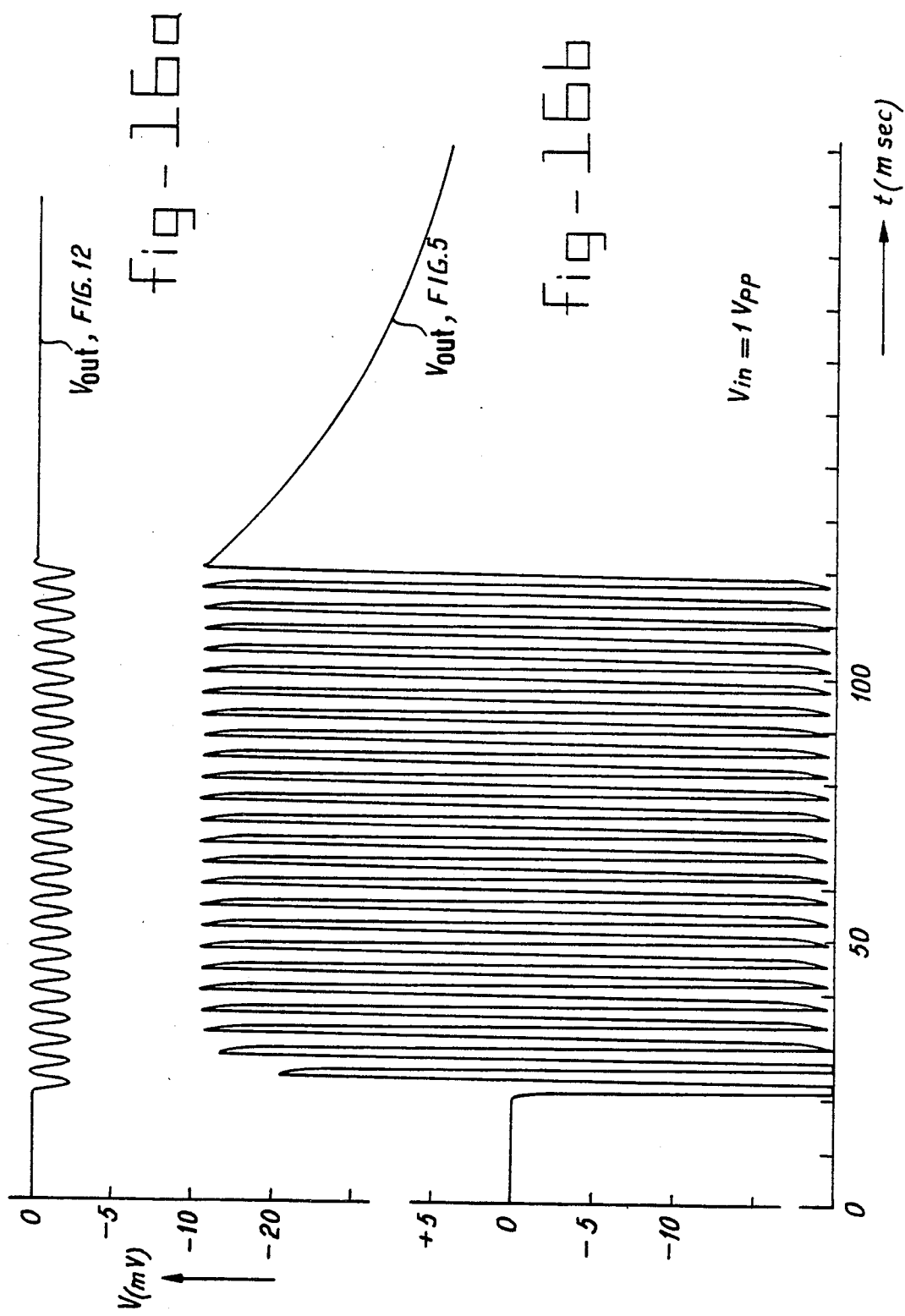

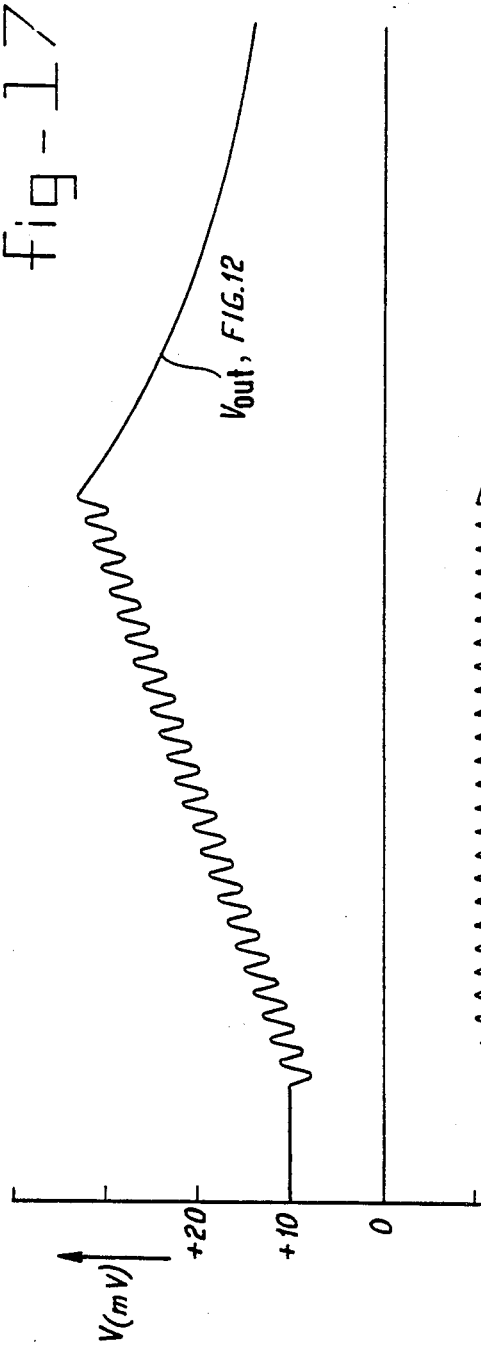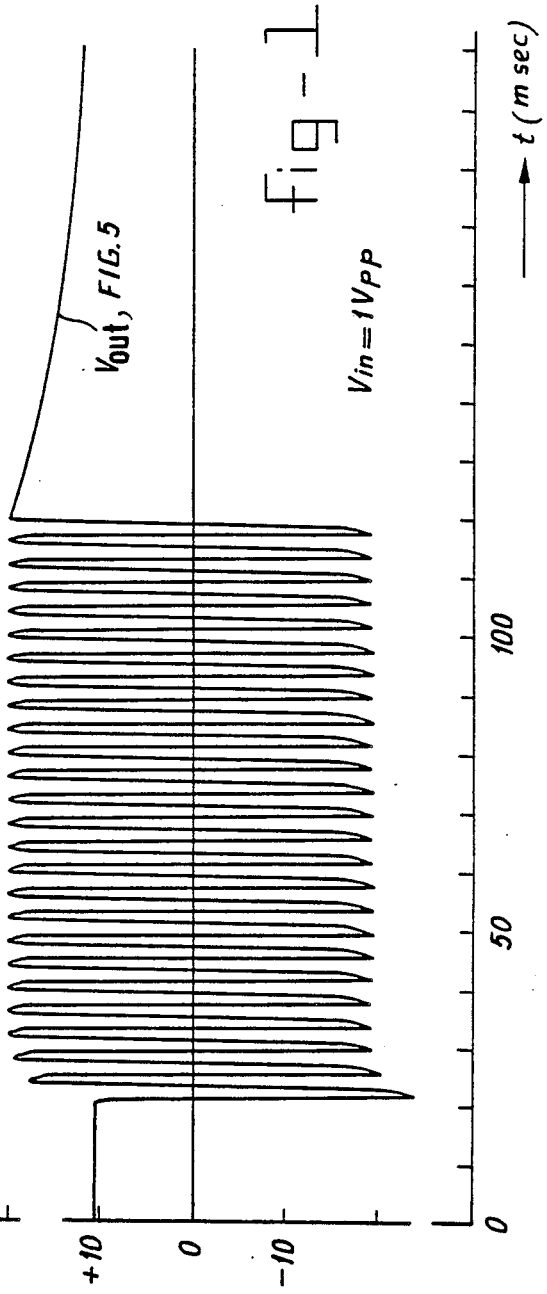

INTEGRATED LOW-PASS FILTER ARRANGEMENT

BACKGROUND OF THE INVENTION

This invention relates to an integrated filter arrangement comprising a resistor section coupled between the input and the output of the arrangement and a capacitor section connected across the output of the arrangement.

Such filter arrangements are generally known per se. If such filters are to be integrated, problems are bound to arise as the resistance and capacitance values increase, in particular because components having comparatively large values also occupy a comparatively large substrate area.

A solution to this problem is the use of transconductor filters as is described, for example, by J.O. Voorman et al in the article "Bipolar Integration of Analog Gyrator and Laguerre Type Filters (Transconductor-Capacitor Filters)", Proceedings of the sixth European Conference of Circuit Theory and Design, Sept. 6–8, 1983, VDE-Verlag GmbH, Berlin Offenbach. In a transconductor filter the resistance is simulated by means of a kind of differential amplifier. The value of the resistor thus simulated is equal to the inverse of the transconductance of the differential amplifier. The resistance value is adjusted by varying the tail current of the differential amplifier and in principle it can be defined accurately.

For several uses and in particular for d.c. control loops, low-pass filters are needed to provide a maximal rejection of a.c. components superimposed on the direct voltage. Such a filter should provide a maximal rejection of spurious signals rather than an accurately defined cut-off frequency. In practice this means that the cut-off frequency should be below a specific value. For many uses it is required, for example, that the cut-off frequency be lower than 10 Hz. If such a filter is to be integrated completely the customary integration techniques will impose a limit of approximately 1 nF on theum maximum capacitance value. This means that in order to obtain a cut-off frequency lower than 10 Hz a resistance value of at least 16 mΩ is needed. In the case of a transconductor filter the tail current of the differential amplifier used therein is required to have value of 6 nA or less. This is such a low current level that leakage currents in the integrated circuit are likely to impair the correct operation of the filter. Moreover, the 1 nF capacitor occupies a comparatively large surface area on the IC (typically approximately 1 mm$^2$). Realising such filters by means of a filter circuit of the transconductor type therefore poses several problems.

SUMMARY OF THE INVENTION

It is an object of the invention to indicate how low-pass filters with a very low cut-off frequency can be integrated without the above problems.

In a filter arrangement of the type defined in the opening paragraph, this object is achieved in that the resistor section comprises two diodes arranged in anti-parallel. According to the invention, use is made of the very high differential resistance of diodes which are operated around the zero point in order to attain the high resistance value required in the arrangement.

If the direct voltage appearing across the diodes poses a problem in view of the resulting offset between the input voltage and the output voltage, it is preferred to utilise a filter arrangement comprising two resistor sections arranged between the respective symmetrical input terminals and the respective symmetrical output terminals, and at least one capacitor section connected to the output, which filter arrangement is characterized in that each of the resistor sections comprises two diodes arranged in anti-parallel.

Another preferred embodiment of the filter arrangement in accordance with the invention is characterized in that each anti-parallel diode array is formed by means of an NPN transistor and a PNP transistor, each having a short-circuited base-collector junction, each having its collector connected to the respective input terminal and whose emitters are connected to the respective output terminal. Such an embodiment has the advantage that the instantaneously cut-off diodes do not contribute to the leakage current to the substrate of the integrated circuit and hence cannot cause a reduction of the differential resistance and a consequent reduction of the filter attenuation.

If the direction and the order of magnitude of the leakage current are known it may be possible to simplify the filter arrangement by dispensing with the non-conductive diode in each anti-parallel diode array. This reduces the parasitic capacitance across each resistor section, resulting in an improved highfrequency rejection.

BRIEF DESCRIPTION OF THE DRAWINGS

The invention will now be described in more detail, by way of example, with reference to the accompanying drawing, in which:

FIGS. 6, 7, 8, 9, 10 and 11 show output signal waveforms obtained by means of a computer simulation based on the arrangement shown in FIG. 5.

FIG. 12 shows a simplified embodiment of the symmetrical filter arrangement in which the non-conducting diodes have been dispensed with.

FIGS. 13 to 16 show output signal waveforms obtained by a computer simulation based on the simplified embodiment shown in FIG. 12, the corresponding output signals for the arrangement of FIG. 5 being shown for comparison.

FIG. 17 illustrates the effect of unequal leakage currents in the simplified arrangement shown in FIG. 12.

DESCRIPTION OF THE PREFERRED EMBODIMENTS

Figure 1:
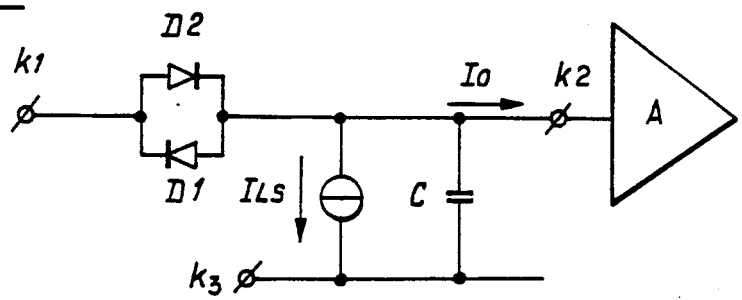
FIG. 1 shows a basic diagram of the integrated low-pass filter in accordance with the invention.

FIG. 1 illustrates the principle of the filter arrangement in accordance with the invention. The arrangement comprises two diodes D1 and D2 arranged in anti-parallel between an input terminal k1 and an output terminal k2. A capacitor C is arranged between the output terminal k2 and a common terminal k3. This common terminal k3 is at a reference potential, generally ground potential. The output signal of the arrangement is supplied to a subsequent circuit, represented diagrammatically by A, via the output terminal k2.

Figure 2:
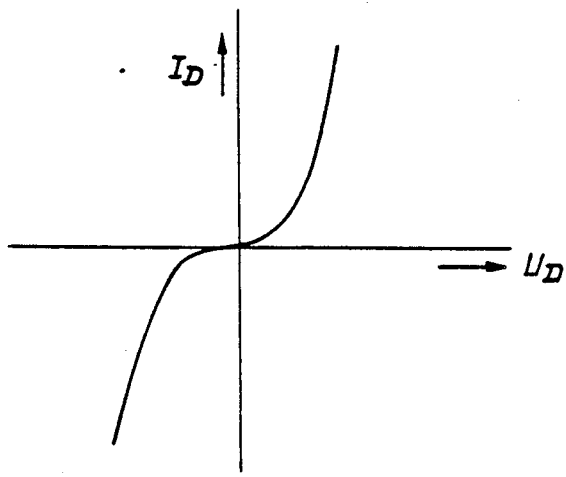
FIG. 2 shows a voltage-current characteristic of an anti-parallel diode array.

FIG. 2 shows the voltage-current characteristic of the parallel array of the two diodes D1 and D2. If the current through this parallel array is kept small the circuit operates in the range around the zero point where the parallel array has comparatively high differential resistance. In the filter in accordance with the invention, this high differential resistance is utilized in order to attain a very low cut-off frequency.

If the filter is integrated this will inevitably lead to a from the terminal k2 to the terminal k3 carrying the common reference potential. In FIG. 1 this leakage current is represented diagrammatically as a current source Ils connected between the output terminal k2 and the common terminal k3. Moreover, there is an output current Io through the terminal k2 to be subsequent stage A. The sum of the two currents Ils and Io should be minimized in order to ensure operation within the range of high differential resistance. The leakage current to the substrate depends on the method of integration but can be very low, of the order of a few picoamperes, in practice. The output current to the circuit A can be minimized by utilizing, for example, a MOSFET input stage or a n-fold Darlington transistor arrangement. The requirements to be imposed on the current through the diodes will be described in detail hereinafter.

Although the arrangement shown in FIG. 1 can be employed in order to realize a filter having a very low cut-off frequency, whose properties will be described in more detail hereinafter, it is sometimes a disadvantage that a voltage developes across the diodes D1/D2 when a current flows through these diodes. Even for very small currents a forward voltage of a few hundreds of millivolts may arise and this forward voltage constitutes an offset between the input voltage and the output voltage of the filter. The use of a symmetrical filter arrangement enables said offset voltage to be reduced substantially, or even to be eliminated completely.

Figure 3:
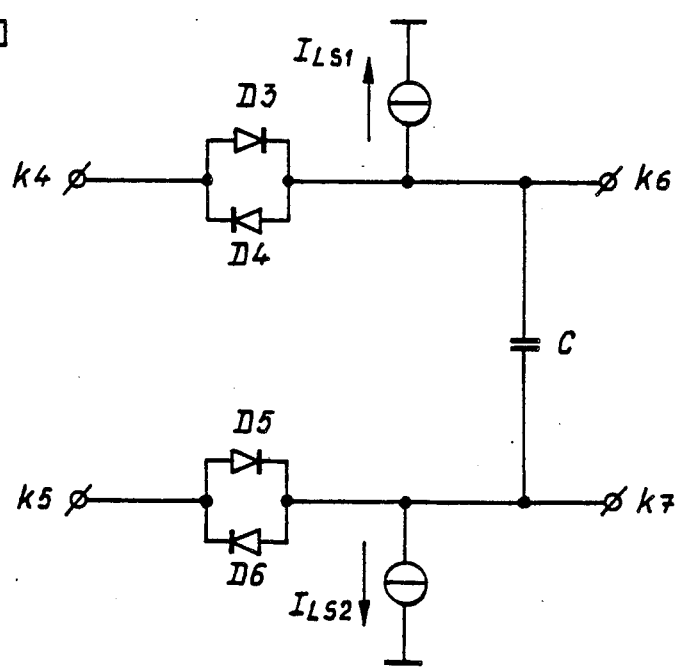
FIG. 3 shows a symmetrical filter arrangement in accordance with the invention.

FIG. 3 shows an example of such a symmetrical arrangement. This arrangement comprises two anti-parallel arrays of diodes, namely the diodes D3 and D4 and the diodes D5 and D6. The array D3/D4 is connected between the input terminal k4 and the output terminal k6 and the array D5/D6 is connected between the input terminal k5 and the output terminal k7. The capacitor C is connected between the output terminals k6 and k7. An input voltage which is symmetrical with respect to ground (or another common symmetry potential) is applied to the input terminals k4 and k5, the output voltage appearing on the output terminals k6 and k7 being also symmetrical.

In this symmetrical embodiment two different leakage currents to ground occur, namely a leakage current Ils1 from the output terminal k6 to ground and a leakage current Ils2 from the output terminal k7 to ground. In FIG. 3 both leakage currents are symbolized by current sources. These leakage currents are exactly equal and if the characteristics of all the diodes are also identical, the offset voltages across the diodes in the two branches will be equal and will consequently cancel one another in the output signal.

In practical integrated circuits the diodes will generally comprise short-circuited transistors. In a preferred embodiment of the invention each parallel array utilizes a combination of an NPN and PNP transistor, each having its base-collector junction short-circuited. Such an arrangement is shown diagrammatically in FIG. 4.

Figure 4:
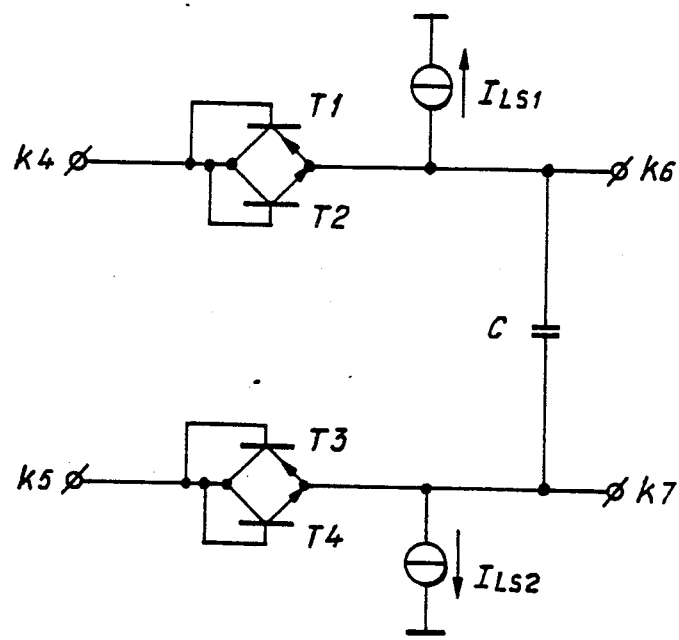
FIG. 4 shows a filter arrangement similar to that of FIG. 3, utilising diode-connected transistors.

FIG. 4 employs a combination of a PNP transistor T1 and an NPN transistor T2 connected in anti-parallel between the input terminal k4 and the output terminal k6. The base-collector junction of each of said transistors is short-circuited. Similarly, the PNP transistor T3 and the NPN transistor T4 are arranged in anti-parallel between the input terminal k5 and the output terminal k7, both transistors having their base-collector junctions short-circuited. In FIG. 4 the leakage currents are again symbolized by by sources Ils1 and Ils2. Such transistor combinations have the advantage that the cut-off diode junctions of these transistors do not contribute to the leakage current to the substrate. The total leakage current to be allowed for can thus be reduced substantially.

Figure 5:
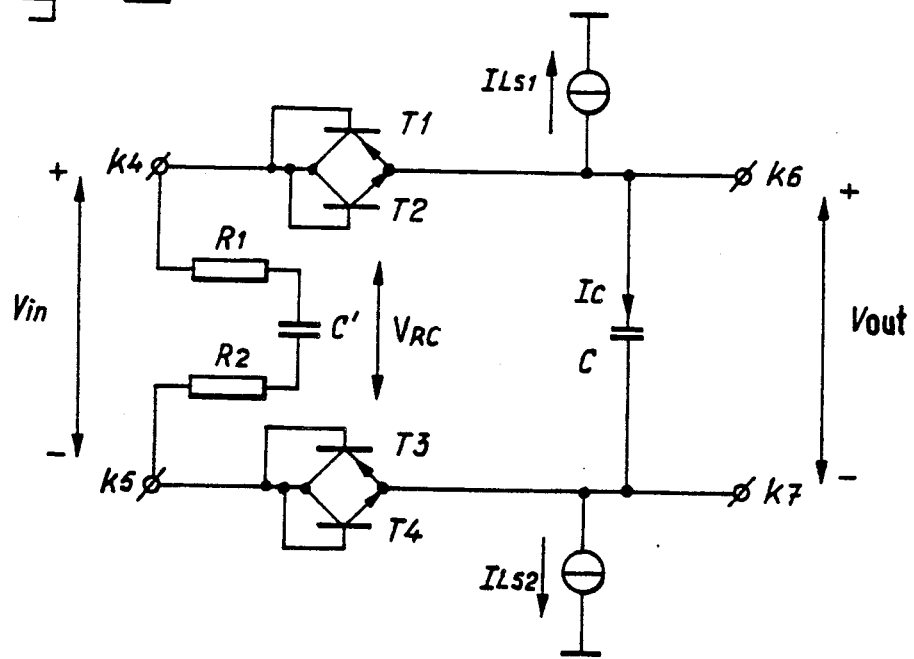
FIG. 5 shows the components of a computer model used to study the performance of the filter arrangement in accordance with the invention.

In order to examine the performance of the arrangements shown in FIGS. 1, 3 and 4 use is made of a computer model, of which the various components are shown in FIG. 5. In the same way as the arrangement shown in FIG. 4, the circuit arrangement comprises the transistors T1 to T4, the capacitor C, the input terminals k4 and k5, and the output terminals k6 and k7. Again two leakage-current sources Ils1 and Ils2 are shown, the leakage currents Ilek of both sources being assumed to be equal. In order to enable this filter arrangement to be compared with a known RC filter, the computer model also includes such a filter, comprising the resistors R1 and R2 and the capacitor C1, which are connected as shown between the input terminals k4 and k5. The value of C1 is equal to the value of C. Each of the resistors R1 and R2 has a value $V_T/Ilek \approx 0.025/Ilek$.

FIG. 6 shows the input signal $V_{in}$ and the output signal $V_{out}$ as a function of time for a specific case. The input signal is a voltage having an amplitude of 20 m$V_{pp}$ and a frequency of 250 Hz. The input voltage in FIG. 6 is shown to a scale of 1:200. The output signal $V_{out}$ is shown to full scale. A comparison of the two signals reveals that the alternating voltage appearing in the output signal has been attenuated by a factor of 80. Assuming that the filter has a first order characteristic, identical to that of a normal RC filter, this means that the cut-off frequency is approximately 3 Hz. There is no, or hardly any, difference between the diode filter and the RC filter, as will become apparent from a comparison between $V_{RC}$ and $V_{out}$.

For a better understanding of the operation of the arrangement, in particular in the case of varying alternating voltage amplitudes, it is useful to examine the variation of the current $I_c$ through the capacitor C. It is found that the situation of FIG. 6 applies to comparatively small input signals for which Vin<25 mV. For larger input signals the input voltage is situated in a range for which Vin>$V_T$; $V_T$=kT/q≈0.025 V. Assuming that the leakage currents from the two leakage current sources Ils1 and Ils2 are equal, hereinafter referred to as Ilek, the current through T2 will be equal to Ic+Ilek. Two situations may then be distinguished:

(a) T4 carries a current Ilek-Ic and T3 is off,
(b) T3 carries a current Ic-Ilek and T4 is off.

If it is also assumed that Vout is substantially lower than Vin, case (a) complies with:

$$V_{in} \approx V_T \cdot \ln \frac{Ic + Ilek}{Is2} - V_T \cdot \ln \frac{Ilek - Ic}{Is4}$$

Moreover, if the junctions of the transistors have identical properties, it is correct to assume that Is2=Is4, which yields:

$$V_{in} \approx V_T \cdot \ln \frac{Ic + Ilek}{Ilek - Ic}$$

$$Ic = Ilek \frac{\exp \frac{Vin}{VT} - 1}{\exp \frac{Vin}{VT} + 1}$$

In addition, Vin>>$V_T$ so that it follows from the foregoing that Ic Ilek. Case (b) complies with:

$$V_{in} \approx V_T \cdot \ln \frac{Ic + Ilek}{Is2} + V_T \cdot \ln \frac{Ic - Ilek}{Is3}$$

Again it is assumed that Is2=Is3 which yields $$V_{in} \approx V_T \cdot \ln \frac{Ic^2 + Ilek^2}{Is2 - Is3}$$

$$Ic^2 = Ilek^2 + Is2Is3 \exp \frac{Vin}{VT}$$

If it is again assumed that $V_{in}$>>$V_T$ it follows from the above that Ic≈Ilek. Thus, in both cases the current Ic through the capacitor is found to be at least approximately equal to the leakage current Ilek through the leakage current sources Ils1 and Ils2.

Figure 7:
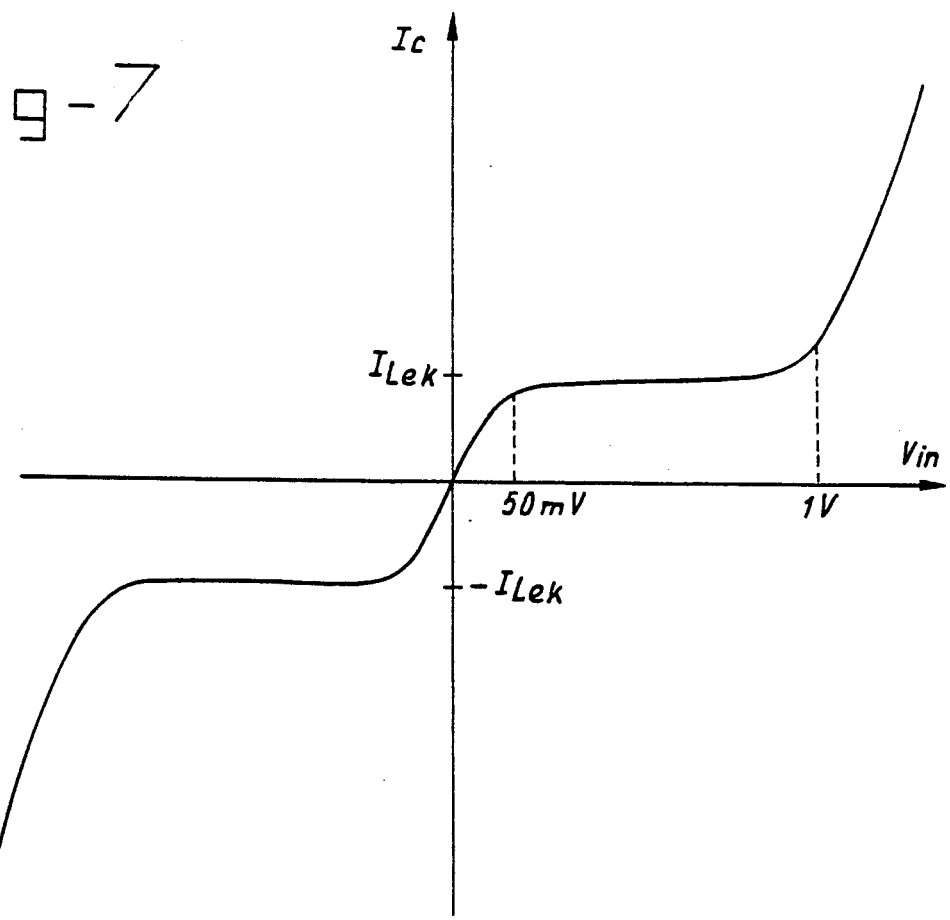

FIG. 7 shows the current Ic as a function of the input voltage. This figure shows that there is a range for which Ic≈Ilek independently of the input voltage. This range is specifically situated between approximately 50 mV and 1 V. If the input voltage is equal to Vin=Vin.sin(2π.f.t) a sinewave voltage distorted to a triangular voltage will appear across the capacitor C, which voltage has a peak-to-peak value of $$Vout_{pp} = \frac{Ilek}{2 \cdot f \cdot C}.$$

In this range the output voltage is found to depend only on the leakage current and is found to be independent of, or hardly dependent on, the input voltage amplitude, which indicates that the relative attenuation of the a.c. signal in the output voltage should increase as the input voltage amplitude increases. This is corroborated by computer simulations carried out by means of the model shown in FIG. 5, the results of which are given in FIGS. 8 and 9. FIG. 8 illustrates the situation in which the input voltage Vin=100 mVpp. A comparison between FIGS. 6 and 8 shows that the relative attenuation of the a.c. voltage signal in FIG. 8 is higher than in FIG. 6. The attenuation factor has increased to approximately 120.

FIG. 9 illustrates the situation in the case that Vin=500 mVpp. The relative attenuation of the a.c. signal has now increased even further, the attenuation factor having increased to approximately 450.

FIGS. 8 and 9 also show the output signal of the RC filter. It is evident that for increasing input signal the attenuation is smaller than the attenuation provided by the diode filter in accordance with the invention.

However, if the amplitude of the input voltage $V_{in}$ increases even further the current through the diodes at approximately twice the threshold voltage of these diodes will constantly increase and charge the capacitor C. This is also evident from FIG. 7, which shows a substantial increase in the current through the capacitor above approximately 1 V. In other words, if Vin becomes higher than twice the threshold voltage of the diodes the voltage across each of the diodes will not increase any further and the residual voltage will appear across the capacitor C. It is to be noted that this applies only to the symmetrical embodiment (FIGS. 3, 4 and 5). For the asymmetrical basic embodiment (FIG. 1) this transition will occur at approximately once the threshold voltage.

The performance of the symmetrical embodiment for higher input voltages is illustrated in FIGS. 10 and 11. FIG. 10 illustrates the situation for Vin=1 Vpp. As will become apparent from a comparison between FIGS. 9 and 10, the relative attenuation of the a.c. signal decreases. In FIG. 10 the attenuation factor is only approx. 50. FIG. 11 illustrates the situation for Vin=1.2 Vpp and this figure shows that a further increase of the input voltage leads to a rapid degradation of the filter. This means that the diode filter can be used only for input voltages of such an amplitude that the threshold voltage of the diode or diodes in the filter arrangement is not exceeded.

FIGS. 10 and 11 also show that in this range of input voltages the performance of the RC filter is better than that of the diode filter.

If at least the approximate magnitude of the input signal is known and the level and the direction of the leakage current are known, the filter may be simplified in some cases. In the amplitude range in which only the diodes T2 and T4 conduct (see FIG. 5) and T1 and T3 are off (case a) intended above), T1 and T3 may be dispensed with. If the leakage current flows in the opposite direction and the transistors T1 and T3 conduct, the two other transistors T2 and T4 may be dispensed with. In this situation the input voltage should still meet the following requirement:

$$V_{in} < 2V_T \cdot \ln \frac{Ilek}{Is2,4}$$

If two of the four diode-connected transistors are dispensed with, this has the advantage that the parasitic capacitance of each anti-parallel diode pair is reduced, as a result of which the attenuation of the filter at higher frequencies increases. Obviously, the filter can thus be simplified only if the leakage current direction is known and, consequently, if it is known which of the diodes in each anti-parallel array does not conduct and may be dispensed with.

FIG. 12 shows an embodiment of a simplified filter. The various components bear the same reference numerals as in FIG. 5. In FIG. 12 it is assumed that the two leakage-current sources carry the same leakage current Ilek. In comparison with FIG. 5 the transistors T1 and T3 have been dispensed with in this simplified embodiment.

FIGS. 13 to 16 illustrate the performance of the simplified embodiment shown in FIG. 12 for different input voltage amplitudes. For the purpose of comparison these figures show the corresponding output signals obtained with the embodiment shown in FIG. 5 and already described with reference to FIGS. 6, 8, 9 and 10. As is apparent from FIGS. 13 to 16, the performance of the two filters is the same for the signals for which the threshold voltage of the diodes is not exceeded. However, if larger signals are applied there appears to be a distinct difference in performance between the two filters, as can be seen in FIG. 16. In the filter comprising the anti-parallel diodes the amplitude of the output voltage increases substantially, in other words the attenuation factor of the filter decreases. However, in the simplified embodiment the amplitude of the output signal remains low. This means that this simplified embodiment is suitable for use with a larger range of input amplitudes.

A disadvantage of this simplified embodiment is that differences in the leakage currents Ilek in the case of overranging of the filter may have an adverse effect. This is illustrated in FIG. 17. This Figure is based on a situation in which the leakage current Ilek at the side of the transistor T2 (see FIG. 12) is 100 pA and the leakage current Ilek at the side of T4 is 150 pA. If in this situation the input signal exceeds the threshold voltage, T4 will be turned off. As a result of this, the leakage current of 150 pA through the lower leakage-current source will charge the capacitor C during the time interval in which T4 is off (every half-cycle). Consequently, the capacitor is charged with a direct current Ilek/2=75 pA. As is shown in FIG. 17, this leads to an increasing d.c. output voltage on which the attenuated alternating voltage is superimposed. Such an effect does not occur in the embodiment of FIG. 5. In said embodiment only said d.c. offset effect arises, leading to a capacitor offset voltage of $V_T \times \ln(\text{Ilek1}/\text{Ilek2}) = 10$ mV.

Figure 18:
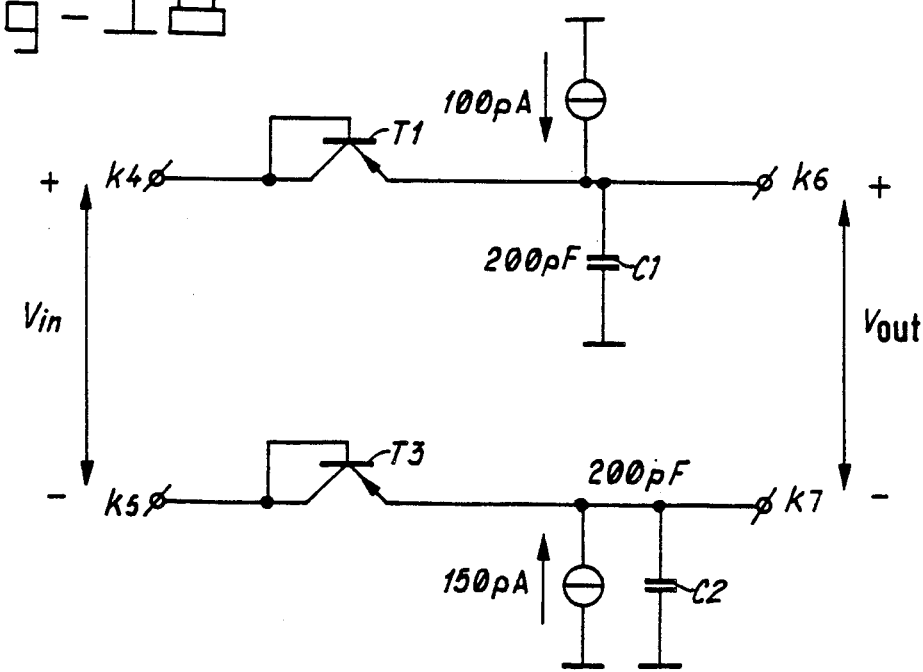
FIG. 18 shows a modified embodiment in which the single capacitor in FIG. 12 is divided into two seperate capacitors.

A solution to this capacitor charging problem may be to split the capacitor into two separate capacitors, each arranged between an output terminal and the symmetry potential of the input and the output voltage. Such an embodiment comprising split capacitors is shown in FIG. 18. The two capacitors bear the references C1 and C2 and the other components bear the same reference numerals as in the preceding Figures. Although the actual charging problem of the capacitors is now avoided, this arrangement has some other disadvantages. First of all, the effective value of the capacitance between the output terminals is reduced to a quarter of the original value. This means that in the case of full integration of this circuit arrangement the chip area required for the capacitors is four times as large in order to obtain the same filter performance. Another disadvantage is that when a considerable peak voltage is applied to the filter the d.c. content of the capacitors is drained only slowly because this is possible only via the leakage current path.

Figure 19:
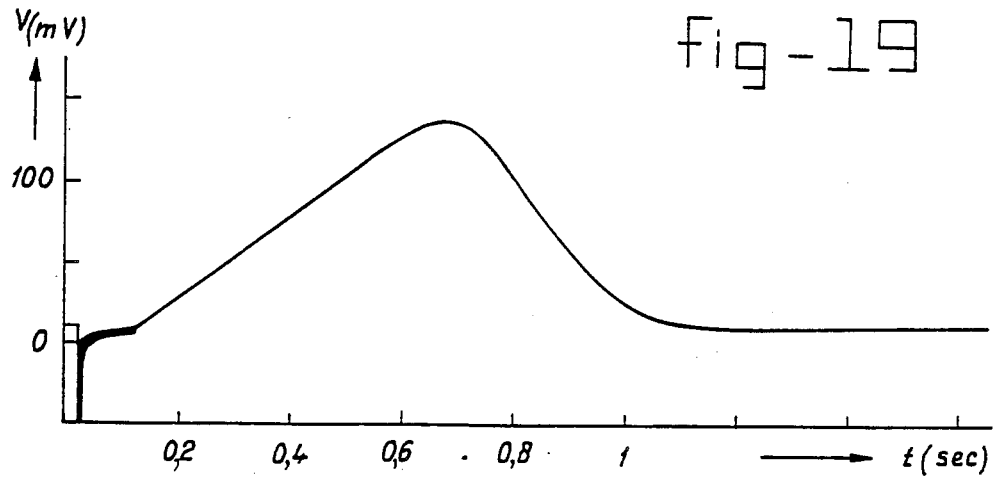
FIGS. 19 and 20 illustrate the performance of the arrangement of FIG. 18, when an input voltage of 1 V applied, FIG. 20 being a kind of "magnification" of FIG. 19.
Figure 20:
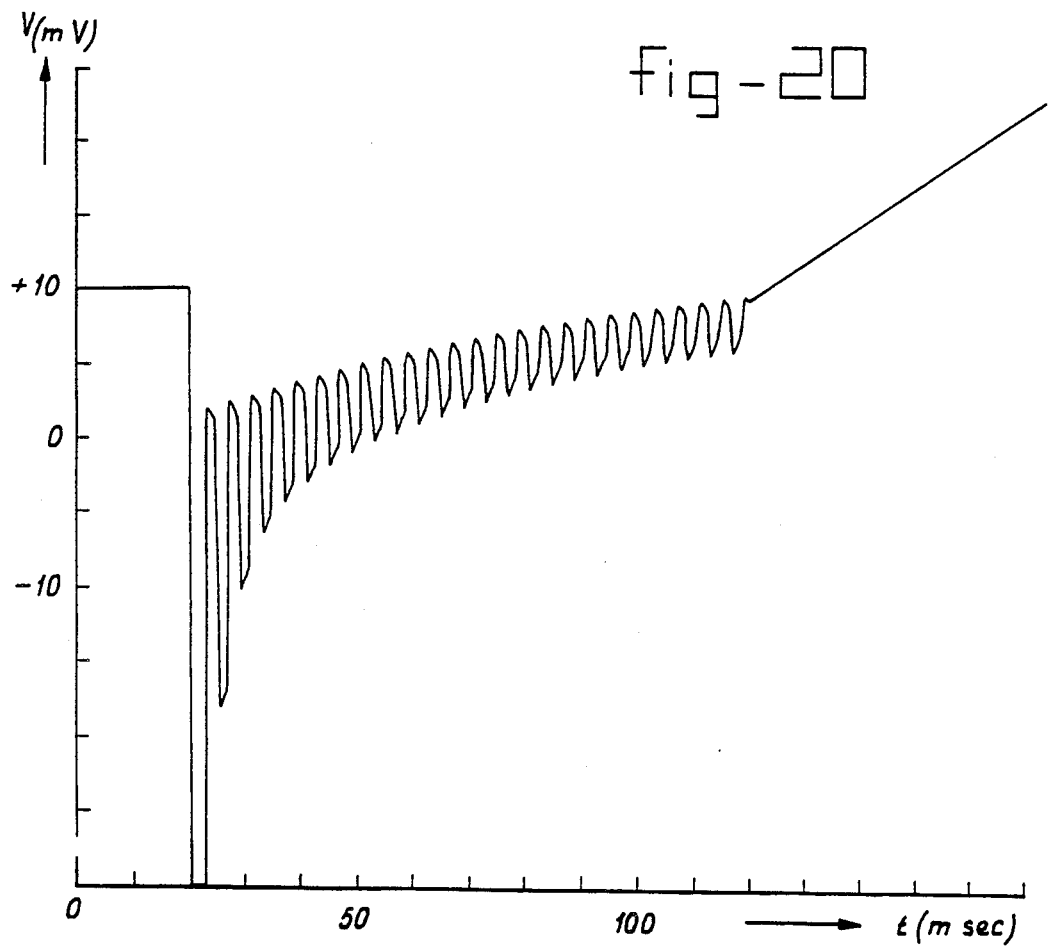
Figure 21:
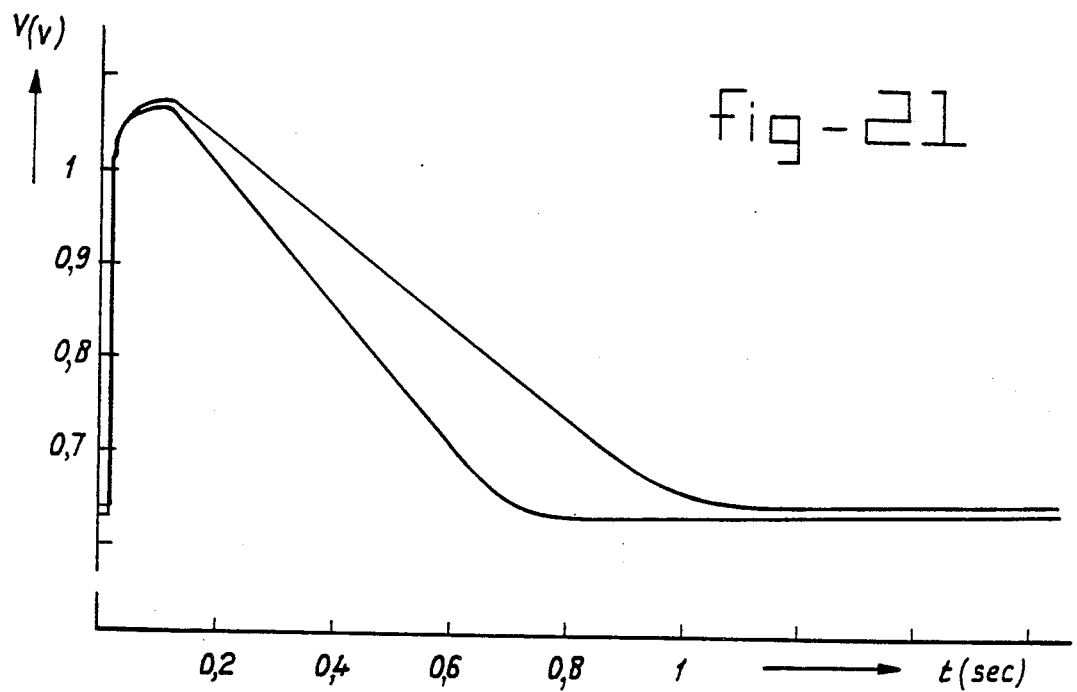
FIGS. 21 and 22 also illustrate the performance of the arrangement shown in FIG. 18 when an input voltage of 1 V is applied, FIG. 22 showing the magnified first part of the signal waveform of FIG. 21.
Figure 22:
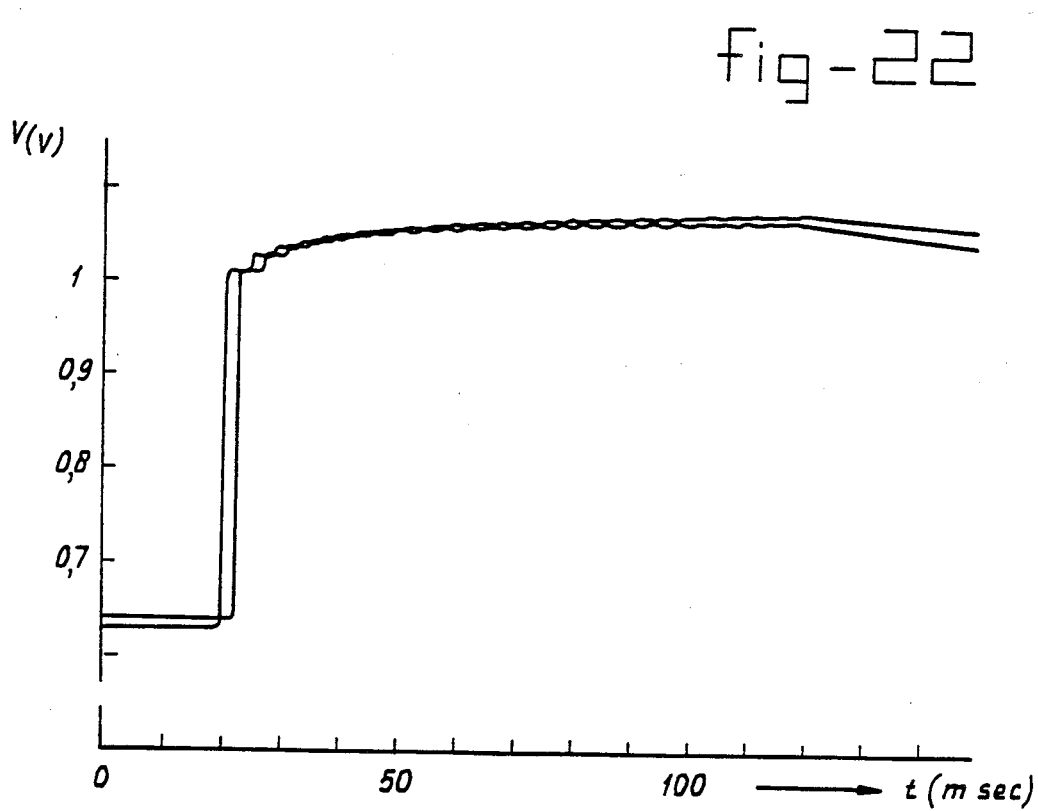

FIGS. 19 to 22 illustrate the performance of the arrangement of FIG. 18 when driven with 1 V. FIG. 20 shows a part of FIG. 19 and FIG. 22 shows a part of FIG. 21 to an enlarged scale. These Figures show that the capacitors are discharged only slowly by the leakage currents. If it is assumed that each of the capacitors has a value of 200 pF and that the leakage currents are again 100 pA and 150 pA respectively, discharging will take approximately 0.4 seconds. The effect of the offset in the leakage current does not disappear until after this time interval.

Figure 23:
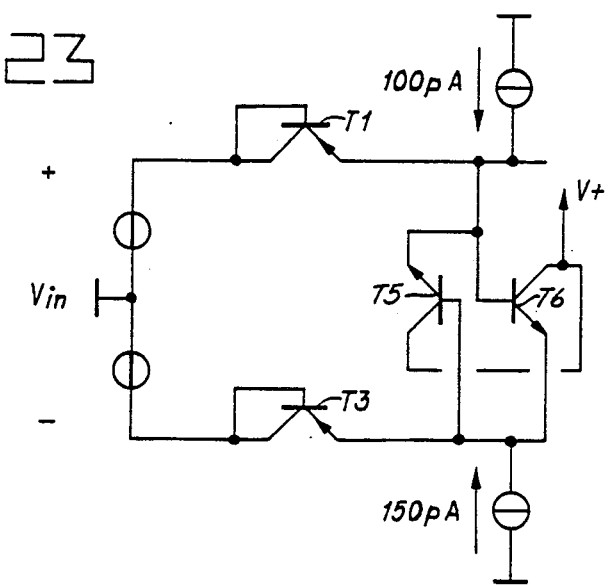
FIG. 23 shows a further embodiment of the arrangement in accordance with the invention in which the junction capacitances of anti-parallel diodes are employed to replace the capacitor.

A solution to the offset problem is illustrated in FIG. 23. In this Figure a combination of additional anti-parallel diodes T5//T6 is arranged across the capacitor C. If the d.c. content of the capacitor becomes too high one of these two additional diodes will drain the leakage current difference, which has a stabilising effect. Moreover, the junction capacitances of the two additional diodes may be added to the overall capacitance value required, so that the actual capacitor can be reduced or under specific conditions may be dispensed with. This last mentioned possibility is in fact illustrated in FIG. 23. In the embodiment shown in FIG. 23 the additional diodes T5 and T6 are also constructed by means of transistors.

Figure 24:
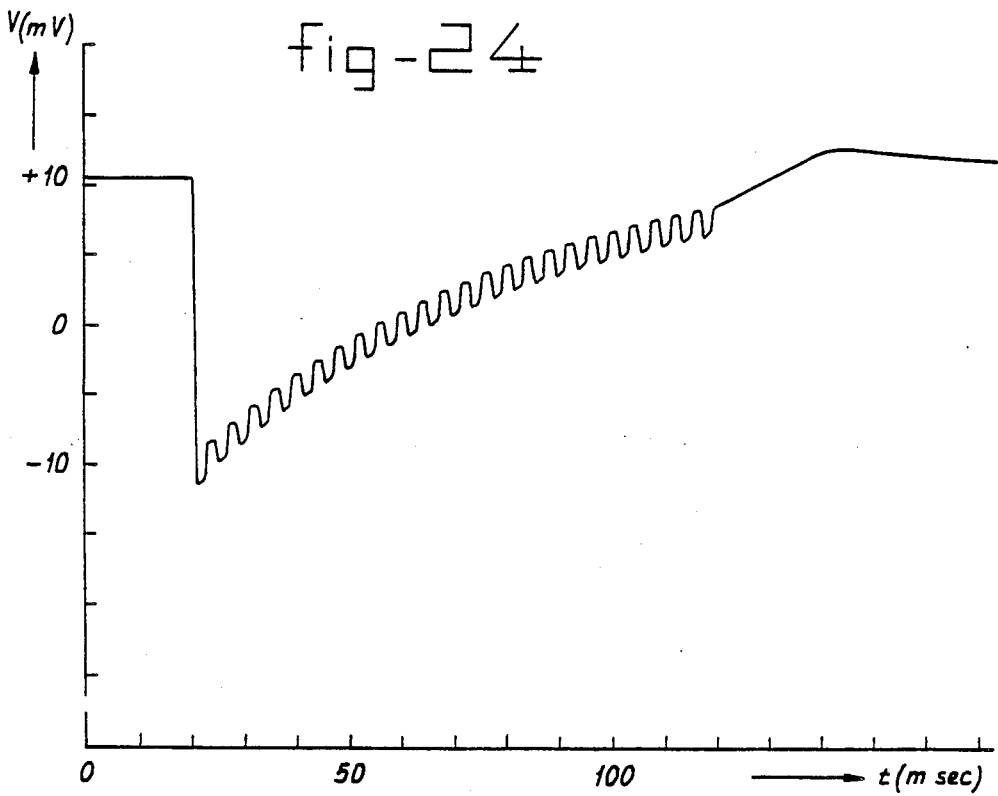
FIG. 24 illustrates the performance of the arrangement shown in FIG. 23 for an input voltage of 1 V.
Figure 1A:
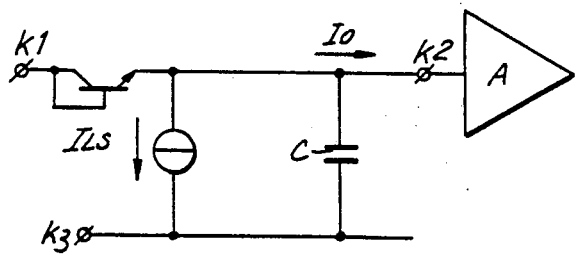
FIG. 1a shows an integrated low pass filter which uses a single diode-connected transister poled in the forward direction for the leakage current.
Figure 4A:
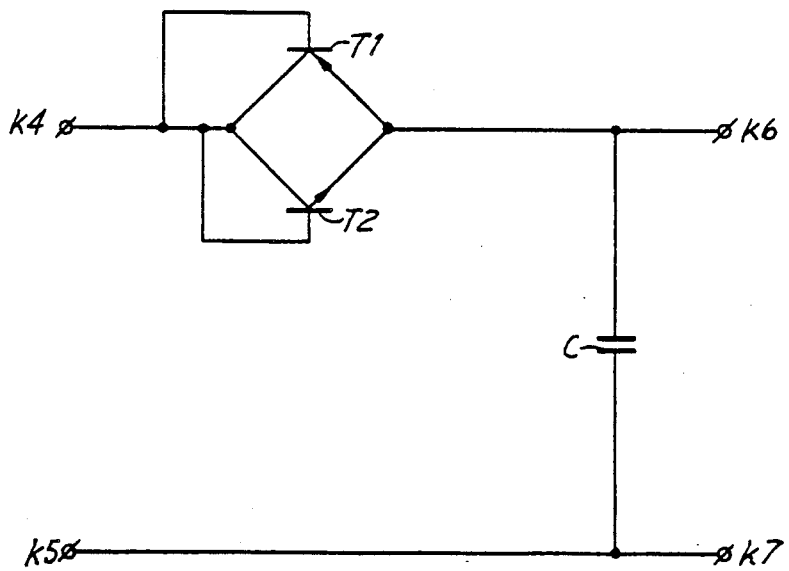
FIG. 4a shows a low pass filter similar to that in FIG. 1 where the diodes consist of diode-connected transistors.

FIG. 24 illustrates the response of the arrangement of FIG. 23 to an input signal of 1 V. Comparison of FIG. 24 with FIG. 20 shows that the offset problem has been eliminated effectively and that only a brief response of the circuit occurs at the beginning of the signal burst.

I claim:

1. An integrated circuit low pass filter arrangement comprising:
   first and second signal input terminals,
   first and second signal output terminals for connection to a load,
   at least one capacitor connected to at least one of said output terminals,
   first and second resistor sections connected between said first input and output terminals and between said second input and output terminals, respectively, and wherein
   each of said resistor sections comprises a pair of diodes connected in anti-parallel.

2. An integrated circuit low pass filter arrangement as claimed in claim 1 wherein said at least one capacitor is connected between said first and second output terminals, and wherein the load and input signal are chosen so that said diodes operate around the zero point in their V-I characteristic and below the characteristic threshold voltage of each diode such that each diode pair operates in the high resistance region of its V-I characteristic.

3. An integrated circuit low pass filter comprising:
   an input terminal and an output terminal,
   a resistor section coupled between said input terminal and said output terminal, said resistor section comprising a diode which is poled only in the forward direction for a leakage current through the resistor section, wherein said diode is limited to operation below its characteristic threshold voltage such that said diode operates only in the high resistance region of its V-I characteristic, and
   a capacitor section coupled to said output terminal.

4. An integrated circuit low-pass filter as claimed in claim 3 wherein the diode in the resistor section comprises a transistor whose base-collector junction is short-circuited.

5. An integrated circuit low pass filter arrangement comprising:
   first and second signal input terminals,
   first and second signal output terminals for connection to a load,
   a capacitor section coupled to said output terminals,
   a resistor section connected between said first input terminal and said first output terminal, wherein said resistor section comprises a pair of diodes connected in anti-parallel and the load and input signal are chosen so that said diodes operate around the zero point in their V-I characteristic and below the characteristic threshold voltage of each diode such that the diode pair operates only in the high resistance region of its V-I characteristic.

6. An integrated low-pass filter arrangement as claimed in claim 5 wherein said anti-parallel diodes comprises an NPN transistor and a PNP transistor, each transistor having a short-circuited base-collector junction, each having its collector connected to the first input terminal, and each having its emitter connected to the first output terminal.

7. An integrated circuit low pass filter arrangement as claimed in claim 5 wherein the parameters of said pair of diodes and said capacitor section are chosen so that the low pass filter has a maximum cut-off frequency of 10 Hz.

8. An integrated low pass filter arrangement comprising, a resistor section coupled between a signal input terminal and an output terminal of the filter arrangement and a capacitor section connected to the output terminal, the resistor section comprising two diodes connected in anti-parallel, wherein said anti-parallel diodes comprise an NPN transistor and a PNP transistor with each transistor having a short circuited base-collector junction, each transistor having its collector connected to the input terminal and its emitter connected to the output terminal.

9. An integrated low pass filter arrangement as claimed in claim 8 wherein said output terminal is adapted to be connected to a load, and wherein said diodes operate around the zero point in their V-I characteristic and below the characteristic threshold voltage of each diode such that the diode pair operates only in the high resistance region of its V-I characteristic.

10. An integrated low pass filter arrangement comprising, first and second input terminals, first and second output terminals for connection to a load, first and second resistor sections connected between said first input and output terminals and between said second input and output terminals, respectively, of the filter arrangement, and at least one capacitor section connected to at least one output terminal of the filter arrangement, each resistor section comprising two anti-parallel diodes including an NPN transistor and a PNP transistor with each transistor having a short-circuited base-collector junction and its collector connected to the respective input terminal and its emitter connected to the respective output terminal.

11. An integrated low pass filter arrangement comprising, first and second input terminals, first and second output terminals for connection to a load, first and second resistor sections connected between said first input and output terminals and between said second input and output terminals, respectively, of the filter arrangement, and at least one capacitor section connected to at least one output terminal of the filter arrangement, wherein each resistor section comprises a transistor having its base-collector junction short circuited and connected to a respective input terminal and its emitter connected to a respective output terminal, each transistor being poled in the forward direction for a leakage current flowing through the associated resistor section.

12. An integrated low pass filter arrangement as claimed in claim 11 wherein the capacitor section includes at least two diode-connected transistors coupled in anti-parallel across the output terminals.

13. An integrated low pass filter arrangement as claimed in claim 11 wherein the capacitor section includes first and second capacitors connected between a point of reference potential and said first and second output terminals, respectively.

* * * * *